United States Patent
Huang (10) Patent No.: US 10,141,896 B2
(45) Date of Patent: Nov. 27, 2018

(54) CURVE FITTING CIRCUIT, ANALOG PREDISTORTER, AND RADIO FREQUENCY SIGNAL TRANSMITTER

(71) Applicant: Huawei Technologies Co., Ltd., Shenzhen (CN)

(72) Inventor: Wei Huang, Chengdu (CN)

(73) Assignee: Huawei Technologies Co., Ltd, Shenzhen (CN)

( * ) Notice: Subject to any disclaimer, the term of this patent is extended or adjusted under 35 U.S.C. 154(b) by 0 days.

(21) Appl. No.: 15/581,823

(22) Filed: Apr. 28, 2017

(65) Prior Publication Data
US 2017/0302233 A1 Oct. 19, 2017

Related U.S. Application Data

(63) Continuation of application No. PCT/CN2014/090095, filed on Oct. 31, 2014.

(51) Int. Cl.
*H04B 1/04* (2006.01)
*H03F 1/32* (2006.01)
(Continued)

(52) U.S. Cl.
CPC ........... *H03F 1/3247* (2013.01); *G06F 17/10* (2013.01); *G06F 17/17* (2013.01); *H03F 1/3258* (2013.01);
(Continued)

(58) Field of Classification Search
CPC ................ G06F 19/00; G06F 9/45558; G06F 2009/45587; G06F 17/2785; G06F 21/552;
(Continued)

(56) References Cited

U.S. PATENT DOCUMENTS 4,086,804 A * 5/1978 Ruby ................. G05D 16/2053
137/487.5
4,990,803 A * 2/1991 Gilbert ................... H03G 7/001
327/351
(Continued)

FOREIGN PATENT DOCUMENTS

CN 101068431 A 11/2007
CN 101141206 A 3/2008
(Continued)

OTHER PUBLICATIONS

Roger, F., "A 200mW 100MHz-to-4GHz 11th-Order Complex Analog Memory Polynomial Predistorter for Wireless Infrastructure RF Amplifiers," 2013 IEEE International Solid-State Circuits Conference (ISSCC), Feb. 18, 2013/Session 5/RF Techniques/5.7, pp. 93-95.

*Primary Examiner* — Ajibola Akinyemi
(74) *Attorney, Agent, or Firm* — Slater Matsil, LLP (57) ABSTRACT

A curve fitting circuit, an analog predistorter, and a radio frequency signal transmitter are disclosed. Each segmentation processing circuit in the curve fitting circuit generates a to-be-processed signal according to a intercepted part of a received signal, and generates q output signals according to the to-be-processed signal. Parts intercepted by different segmentation processing circuits are not exactly the same. Each first adder circuit in the curve fitting circuit receives one signal in the q output signals of each segmentation processing circuit, and obtains one output signal of the curve fitting circuit according to a sum of received n signals.

17 Claims, 5 Drawing Sheets

(51) Int. Cl.
*G06F 17/10* (2006.01)
*H03F 3/19* (2006.01)
*H03F 3/24* (2006.01)
*H03F 3/189* (2006.01)
*H03F 3/20* (2006.01)
*G06F 17/17* (2006.01)

(52) U.S. Cl.
CPC ............. *H03F 3/189* (2013.01); *H03F 3/19* (2013.01); *H03F 3/20* (2013.01); *H03F 3/245* (2013.01); *H03F 2200/102* (2013.01); *H03F 2200/451* (2013.01)

(58) Field of Classification Search
CPC .... G06F 3/017; G06F 9/45533; G06F 17/274; G06F 17/3053; G06F 17/30781; G06F 17/30867; G06F 2009/45595; G06F 3/0304; G06F 17/10; G06F 17/17
USPC ...................................................... 455/114.3
See application file for complete search history.

(56) References Cited

U.S. PATENT DOCUMENTS

| | | |
|---|---|---|
| 6,252,458 B1 | 6/2001 | Shibata |
| 6,425,111 B1 | 7/2002 | del Mar Hershenson |
| 6,678,710 B1 * | 1/2004 | Shankar ................ G06F 7/4833 708/517 |
| 2006/0221326 A1 * | 10/2006 | Cok ..................... G09G 3/3208 356/121 |
| 2010/0156530 A1 | 6/2010 | Utsunomiya et al. |
| 2010/0240983 A1 | 9/2010 | Jung et al. |
| 2010/0315275 A1 | 12/2010 | Murahashi |
| 2011/0053532 A1 | 3/2011 | Fudaba et al. |
| 2011/0187455 A1 | 8/2011 | Sun et al. |
| 2011/0195672 A1 | 8/2011 | Pratt et al. |
| 2013/0282332 A1 | 10/2013 | Yang et al. |

FOREIGN PATENT DOCUMENTS

| | | |
|---|---|---|
| CN | 102551712 A | 7/2012 |
| CN | 103175547 A | 6/2013 |
| CN | 103257269 A | 8/2013 |
| CN | 103970719 A | 8/2014 |
| JP | 2000174568 A | 6/2000 |
| JP | 2010147805 A | 7/2010 |
| JP | 2010157936 A | 7/2010 |
| JP | 2011055364 A | 3/2011 |
| JP | 2011205620 A | 10/2011 |
| WO | 2008081887 A1 | 7/2008 |
| WO | 2013184483 A1 | 12/2013 |

* cited by examiner

CURVE FITTING CIRCUIT, ANALOG
PREDISTORTER, AND RADIO FREQUENCY
SIGNAL TRANSMITTER

CROSS-REFERENCE TO RELATED APPLICATIONS

This application is a continuation of International Application No. PCT/CN2014/090095, filed on Oct. 31, 2014, the disclosure of which is hereby incorporated by reference in its entirety.

TECHNICAL FIELD

The present invention relates to the field of communications technologies, and in particular, to a curve fitting circuit, an analog predistorter, and a radio frequency signal transmitter.

BACKGROUND

A multi-input radio frequency power amplifier is a power amplifier that has two or more radio frequency signal input ends and a single output end. Compared with a conventional single-input single-output radio frequency power amplifier, the multi-input radio frequency power amplifier has better performance. In addition, a relationship between amplitude and a phase of each input signal of the multi-input radio frequency power amplifier can be adjusted. Therefore, the multi-input radio frequency power amplifier has better performance, and the multi-input radio frequency power amplifier attracts more attention.

Figure 1:
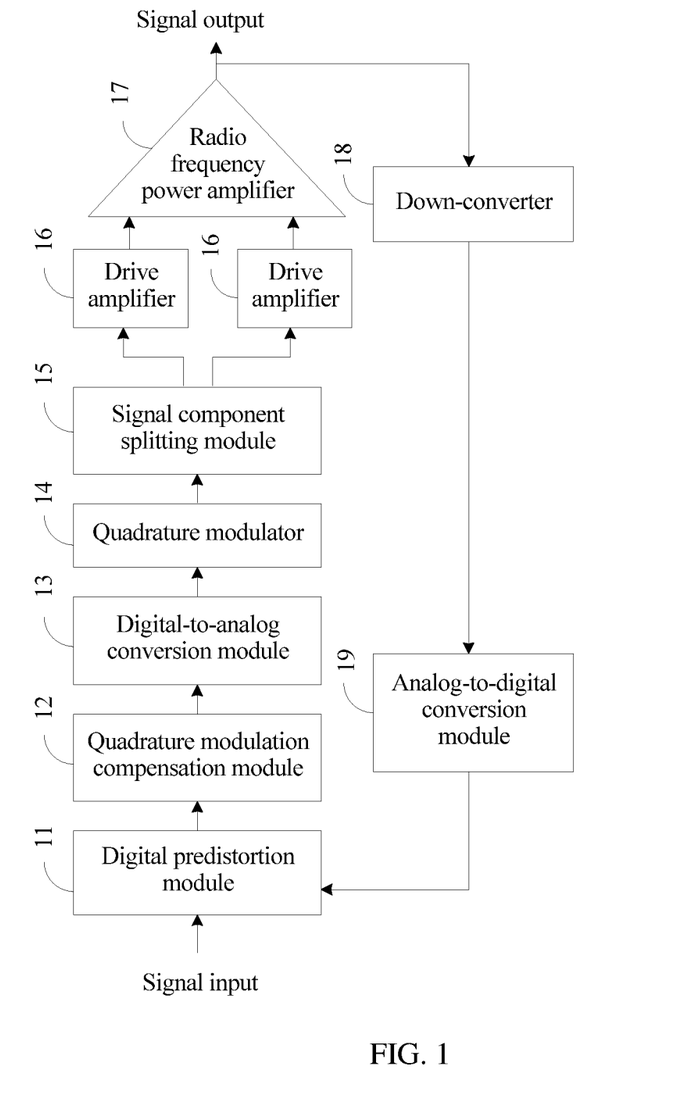
FIG. 1 is a schematic structural diagram of a transmitter using a radio frequency signal decomposition solution in the prior art.

A conventional transmitter using a multi-input power amplifier requires at least two complete radio frequency small-signal links. In this case, a quantity of small-signal paths increases in the transmitter, and a structure of the transmitter becomes complex. To simplify a structure of a transmitter, a radio frequency signal decomposition solution is generally used in a current transmitter. The structure of the transmitter in which the radio frequency signal decomposition solution is used may be shown in FIG. 1: A signal component splitting module 15 receives a signal output by a quadrature modulator 14, decomposes the received signal into two channels of signals, and outputs the signals into two drive amplifiers 16. The transmitter shown in FIG. 1 further includes a digital predistortion module 11, a quadrature modulation compensation module 12, a digital-to-analog conversion module 13, a radio frequency power amplifier 17, a down-converter 18, and an analog-to-digital conversion module 19.

Figure 2:
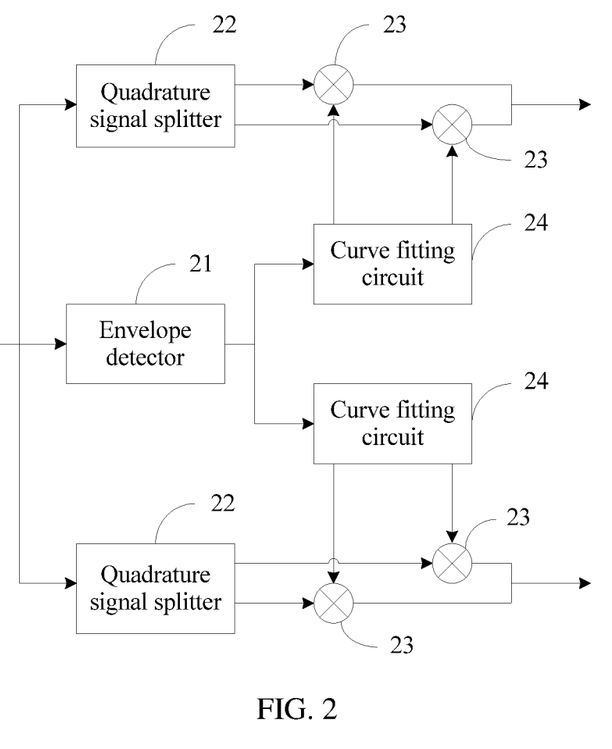
FIG. 2 is a schematic structural diagram of a signal component splitting module in the prior art.

As shown in FIG. 2, the signal component splitting module includes an envelope detector 21, a quadrature signal splitter 22, a multiplier 23, and a curve fitting circuit 24. A design of the curve fitting circuit 24 is a key in the signal component splitting module, and a function of the curve fitting circuit is to convert an input signal represented by a real number into an output signal represented by a complex number. The curve fitting circuit implements mathematical computation by using a circuit. Therefore, an error is unavoidable, and this requires that a circuit structure features a particular tolerance.

A polynomial fitting method is generally used to implement the function of the curve fitting circuit. For example, a relationship between a signal x and a signal y is y=f(x). After the curve fitting circuit receives the signal x, the curve fitting circuit uses $x^n$ as a basis function to fit the relationship between the signal x and the signal y and obtains $y=a*x^5+b*x^4+c*x^3+d*x^2+e*x^1+f$, so as to output the signal y, where basis functions are respectively $x^5, x^4, x^3, x^2, x^1$, and $x^0$, and a, b, c, d, e, and f are respectively coefficients of the basis functions.

When polynomial-fitting is directly used, the signal component splitting module implementing a radio frequency signal decomposition function needs to fit a relatively complex curve. Generally, a higher order polynomial needs to be used. In this case, a fitting result is very sensitive to a higher order term coefficient, that is, a higher order coefficient. In addition, because the higher order polynomial is used, the fitting result is also very sensitive to a quantization noise.

In conclusion, a curve that needs to be fit during radio frequency signal decomposition is relatively complex, and a higher order polynomial is generally used when a current polynomial fitting method is used. Therefore, a fitting result is not only very sensitive to a higher order term coefficient, but also very sensitive to a quantization noise.

SUMMARY

Embodiments of the present invention provide a curve fitting circuit, an analog predistorter, and a radio frequency signal transmitter, so as to resolve a problem that, when radio frequency signal decomposition is performed by using an existing polynomial fitting method, a fitting result caused by frequent use of a higher order polynomial is very sensitive to both a higher order term coefficient and a quantization noise.

According to a first aspect, a curve fitting circuit is provided, including n segmentation processing circuits and q first adder circuits, where n is greater than or equal to 2, and q is a natural number. Each segmentation processing circuit receives an input signal, intercepts a part of the input signal according to a preset rule, generates a to-be-processed signal according to the intercepted part, and generates q output signals according to the to-be-processed signal by using a polynomial fitting method, where parts intercepted by different segmentation processing circuits are not exactly the same. Each first adder circuit receives one signal in the q output signals of each segmentation processing circuit, and obtains one output signal of the curve fitting circuit according to a sum of received n signals, where different first adder circuits receive different output signals in q output signals of a same segmentation processing circuit.

With reference to the first aspect, in a first possible implementation manner, each first adder circuit is specifically configured to: receive one signal in the q output signals output by each segmentation processing circuit; and when none of the q output signals of each segmentation processing circuit includes a constant term, use a signal, obtained by adding the sum of the received n signals to a constant term, as one output signal of the curve fitting circuit, or when q output signals of at least one segmentation processing circuit include a constant term, use the sum of the received n signals as one output signal of the curve fitting circuit.

With reference to the first aspect, in a second possible implementation manner, each segmentation processing circuit is specifically configured to: receive an input signal, determine an intercepted part according to an amplitude of the input signal and a preset amplitude range of the segmentation processing circuit, generate a to-be-processed signal according to the intercepted part, and generate q output signals according to the to-be-processed signal by using the polynomial fitting method.

With reference to the first aspect, in a third possible implementation manner, each segmentation processing circuit is specifically configured to: receive an input signal, intercept a part between two points of the input signal, generate a to-be-processed signal according to the intercepted part, and generate q output signals according to the to-be-processed signal by using the polynomial fitting method.

With reference to the third possible implementation manner of the first aspect, in a fourth possible implementation manner, each segmentation processing circuit includes an amplitude limiting circuit, a polynomial operation circuit, and a weighting circuit, where the amplitude limiting circuit receives an input signal; and generates and outputs, when an amplitude of the input signal is within a preset amplitude range of the segmentation processing circuit at which the amplitude limiting circuit is located, a to-be-processed signal whose amplitude monotonically varies according to the amplitude of the input signal, or outputs a first preset value when an amplitude of the input signal is less than a minimum value of the preset amplitude range, or outputs a second preset value when an amplitude of the input signal is greater than a maximum value of the preset amplitude range, where the first preset value is equal to an amplitude of a to-be-processed signal that is generated when the amplitude of the input signal is the minimum value of the preset amplitude range, and the second preset value is equal to an amplitude of a to-be-processed signal that is generated when the amplitude of the input signal is the maximum value of the preset amplitude range; the polynomial operation circuit generates, according to the amplitude of the to-be-processed signal output by the amplitude limiting circuit, a value of each order of computation term whose order is not higher than a preset order; and the weighting circuit receives the value of each order of computation term and generates an output signal of the segmentation processing circuit according to a coefficient that is of each order of computation term and that is in weighting coefficients and according to the value of each order of computation term.

With reference to the fourth possible implementation manner of the first aspect, in a fifth possible implementation manner, the amplitude limiting circuit includes a pre-adjustment circuit and an amplitude limiting amplifier circuit, where the pre-adjustment circuit receives an input signal and outputs a signal obtained by amplifying the input signal and/or performing offset adjustment on the input signal; and the amplitude limiting amplifier circuit receives the signal output by the pre-adjustment circuit; and generates and outputs, when an amplitude of the signal output by the pre-adjustment circuit is within an amplitude limiting range of the amplitude limiting amplifier circuit, a to-be-processed signal whose amplitude monotonically varies according to the amplitude of the signal output by the pre-adjustment circuit, or outputs the first preset value when the amplitude of the signal output by the pre-adjustment circuit is less than a minimum value of the amplitude limiting range of the amplitude limiting amplifier circuit, or outputs the second preset value when the amplitude of the signal output by the pre-adjustment circuit is greater than a maximum value of the amplitude limiting range of the amplitude limiting amplifier circuit, where a mapping relationship between the amplitude limiting range of the amplitude limiting amplifier circuit and the preset amplitude range of the segmentation processing circuit at which the amplitude limiting amplifier circuit is located is the same as a mapping relationship between the input signal received by the pre-adjustment circuit and the signal output by the pre-adjustment circuit.

With reference to the fifth possible implementation manner of the first aspect, in a sixth possible implementation manner, the amplitude limiting amplifier circuit includes a first triode, a second triode, a third triode, a fourth triode, a first resistor, a second resistor, a third resistor, a fourth resistor, a fifth resistor, a sixth resistor, and a seventh resistor, where one end of the first resistor receives an amplitude-limited signal, the other end of the first resistor is separately connected to a collector of the first triode, a base of the first triode, and a base of the second triode, an emitter of the first triode is grounded by using the second resistor, an emitter of the second triode is grounded by using the third resistor, and a collector of the second triode outputs a signal related to an amplitude of the amplitude-limited signal; a base of the third triode receives a first input signal, a base of the fourth triode receives a second input signal, a collector of the third triode is connected to a collector of the fourth triode by sequentially using the fourth resistor and the fifth resistor, an emitter of the third triode is connected to an emitter of the fourth triode by sequentially using the sixth resistor and the seventh resistor, an end on which the sixth resistor is connected to the seventh resistor receives the signal related to the amplitude of the amplitude-limited signal, a signal on an end on which the fourth resistor is connected to the collector of the third triode is one channel of signal in two channels of signals output by the amplitude limiting amplifier circuit, and a signal on an end on which the fifth resistor is connected to the collector of the fourth triode is the other channel of signal in the two channels of signals output by the amplitude limiting amplifier circuit, where a difference between the first input signal and the second input signal is equal to the signal output by the pre-adjustment circuit, and a difference between the two channels of signals output by the amplitude limiting amplifier circuit is the to-be-processed signal output by the amplitude limiting circuit at which the amplitude limiting amplifier circuit is located.

With reference to the fourth possible implementation manner of the first aspect, in a seventh possible implementation manner, the preset order is m, the polynomial operation circuit includes m−1 multipliers, and one input end of each multiplier receives a signal output by the amplitude limiting circuit in the segmentation processing circuit at which the polynomial operation circuit is located; the other input end of a first multiplier receives the signal output by the amplitude limiting circuit in the segmentation processing circuit at which the polynomial operation circuit is located, and the other input end of an $l^{th}$ multiplier receives a signal output by an $(l-1)^{th}$ multiplier, where l=2, . . . , m; and a signal output by a $p^{th}$ multiplier is the $(p+1)^{th}$ power of the signal output by the amplitude limiting circuit in the segmentation processing circuit at which the polynomial operation circuit is located, where p=1, . . . , m−1.

With reference to the fourth possible implementation manner of the first aspect, in an eighth possible implementation manner, the preset order is m, and the weighting circuit includes n*m multipliers and n second adder circuits, where the n*m multipliers are divided into n groups, each group has m multipliers, and n is a natural number; one input end of each multiplier in a $k^{th}$ group receives one of values that are of orders of computation terms and that are output by the polynomial operation circuit; and when one input end of a multiplier in the $k^{th}$ group receives a value that is of an $l^{th}$ order of computation term and that is output by the polynomial operation circuit, and the other input end of the multiplier receives a coefficient that is of the $l^{th}$ order of computation term and that is in a $k^{th}$ group of coefficients in the weighting coefficients, where k=1, . . . , n, and l is a natural number not greater than m; and each second adder circuit outputs a signal obtained by adding signals output by multipliers in a group, and uses the signal as one output signal of the segmentation processing circuit at which the weighting circuit is located.

According to a second aspect of the embodiments of the present invention, an analog predistorter is provided, including a curve fitting circuit.

According to a third aspect of the embodiments of the present invention, a radio frequency signal transmitter is provided, including a curve fitting circuit.

Beneficial effects of the embodiments of the present invention include the following.

According to the curve fitting circuit, the analog predistorter, and the radio frequency signal transmitter that are provided in the embodiments of the present invention, each segmentation processing circuit in the curve fitting circuit intercepts a part of an input signal, and each segmentation processing circuit fits only the part intercepted by the segmentation processing circuit. In this case, even though the input signal is complex, after the input signal is divided into n parts, complexity of each part of signal is greatly reduced. Therefore, when each segmentation processing circuit generates an output signal according to only a part of signal in the input signal by using a polynomial fitting method, a highest order of basis functions in a used polynomial is reduced. This makes an output signal of each segmentation processing circuit less sensitive to both a higher order term coefficient and a quantization noise, thereby making an output signal of the curve fitting circuit less sensitive to both the higher order term coefficient and the quantization noise.

BRIEF DESCRIPTION OF THE DRAWINGS

For the understanding of the present invention, and the advantages thereof, reference is now made to the following descriptions taken in conjunction with the accompanying drawings, in which.

DETAILED DESCRIPTION OF ILLUSTRATIVE EMBODIMENTS

Embodiments of the present invention provide a curve fitting circuit, an analog predistorter, and a radio frequency signal transmitter. Each segmentation processing circuit in the curve fitting circuit generates q output signals according to only a part of an input signal by using a polynomial fitting method. After the input signal is divided into n parts, complexity of each part of signal is greatly reduced. Therefore, when each segmentation processing circuit uses a polynomial fitting method, a highest order of basis functions in a used polynomial is reduced. This makes an output signal of each segmentation processing circuit less sensitive to both a higher order term coefficient and a quantization noise, thereby making an output signal of the curve fitting circuit less sensitive to both the higher order term coefficient and the quantization noise.

The following describes, with reference to the accompanying drawings in the specification, specific embodiments of the curve fitting circuit, the analog predistorter, and the radio frequency signal transmitter that are provided in the embodiments of the present invention.

Figure 3:
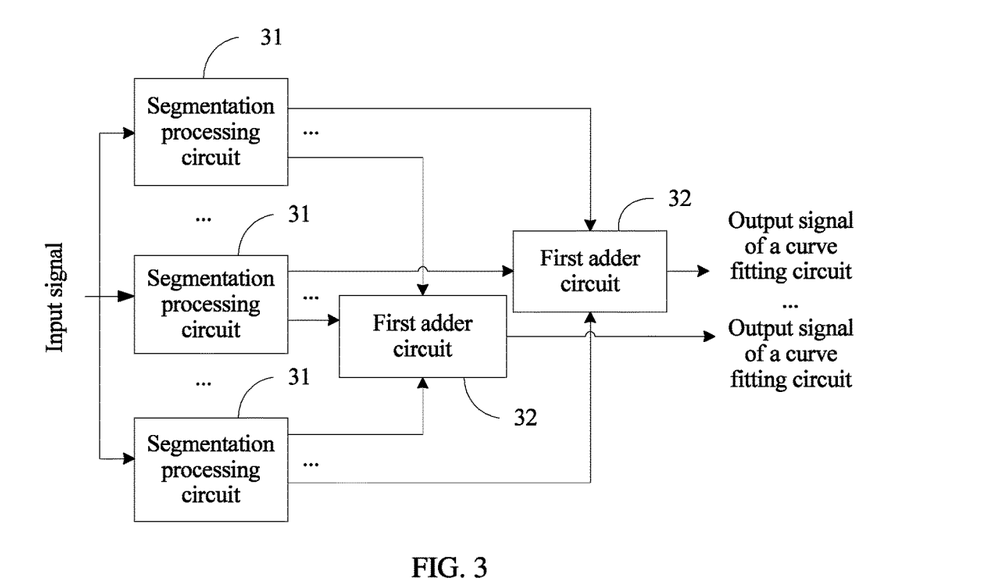
FIG. 3 is a schematic structural diagram of a curve fitting circuit according to an embodiment of the present invention.

An embodiment of the present invention provides a curve fitting circuit, as shown in FIG. 3, including n segmentation processing circuits 31 and q first adder circuits 32, where n is greater than or equal to 2, and q is a natural number.

Each segmentation processing circuit 31 receives an input signal, intercepts a part of the input signal according to a preset rule, generates a to-be-processed signal according to the intercepted part, and generates q output signals according to the to-be-processed signal by using a polynomial fitting method, where parts intercepted by different segmentation processing circuits are not exactly the same.

Each first adder circuit 32 is configured to: receive one signal in the q output signals of each segmentation processing circuit 31, and obtain one output signal of the curve fitting circuit according to a sum of received n signals, where different first adder circuits 32 receive different output signals in q output signals of a same segmentation processing circuit 31.

The capturing a part of the input signal according to the preset rule may be capturing a part of the input signal whose amplitude is within a preset amplitude range of the segmentation processing circuit, or may be capturing a part between two points of the input signal, or may be capturing the input signal according to another feature of the input signal.

For example, a signal A is fit to obtain a signal B. In a process of directly fitting the signal A without dividing the signal A into multiple parts, only after a highest order of basis functions in a to-be-used polynomial is 5, target accuracy can be reached. That is, the basis functions in the to-be-used polynomial are respectively $x^5$, $x^4$, $x^3$, $x^2$, $x^1$ and $x^0$. After the signal A is divided into several parts according to a particular rule, a complexity degree of each part of signal is lower than a complexity degree of the signal A. Therefore, in a process of performing fitting according to a part of the signal A, the target accuracy can be reached when the highest order of the basis functions in the to-be-used polynomial is less than 5. In this case, after the signal A is divided into several parts, when fitting is performed according to each part by using the polynomial fitting method, a fitting result is less sensitive to both a higher order coefficient and a quantization noise are reduced.

If only one curve needs to be fit, for example, a real signal is fit to obtain a real signal, each segmentation processing circuit generates only one output signal. After a first adder circuit 32 adds the output signal of each segmentation processing circuit, an output signal of the curve fitting circuit provided in this embodiment of the present invention is obtained, and the curve fitting circuit has only one output signal.

If two curves need to be fit, for example, a real signal is fit to obtain a complex signal, each segmentation processing circuit needs to generate two output signals. After receiving one output signal of each segmentation processing circuit, a first adder circuit adds received n output signals and obtains one output signal of the curve fitting circuit; and after receiving one output signal of each segmentation processing circuit, the other first adder circuit adds received n output signals and obtains the other output signal of the curve fitting circuit. The two first adder circuits receive different output signals in two output signals of a same segmentation processing circuit. One output signal of the curve fitting circuit is a real part of the complex signal, and the other output signal of the curve fitting circuit is an imaginary part of the complex signal.

If q curves need to be fit, each segmentation processing circuit needs to generate q output signals. Each first adder circuit receives one signal in the q signals output by each segmentation processing circuit, and uses a signal, obtained by adding received n signals, as one output signal of the curve fitting circuit. Different first adder circuits receive different output signals in q output signals of a same segmentation processing circuit, so as to obtain q output signals of the curve fitting circuit.

Optionally, each first adder circuit is specifically configured to: receive one signal in the q output signals output by each segmentation processing circuit; and when none of the q output signals of each segmentation processing circuit includes a constant term, use a signal, obtained by adding the sum of the received n signals to a constant term, as one output signal of the curve fitting circuit, or when q output signals of at least one segmentation processing circuit include a constant term, use the sum of the received n signals as one output signal of the curve fitting circuit.

That is, when each segmentation processing circuit generates the output signals according to the to-be-processed signal by using the polynomial fitting method, and when a used polynomial includes no constant term (that is, a constant), after adding the received n signals, each first adder circuit further needs to add a constant, and uses a signal, obtained by adding the constant, as one output signal of the curve fitting circuit.

When at least one segmentation processing circuit in the n segmentation processing circuits generates the output signals according to the to-be-processed signal by using the polynomial fitting method, and when a used polynomial includes a constant term (that is, a constant), each first adder circuit may add only the received n signals and use the sum as one output signal of the curve fitting circuit.

Optionally, each segmentation processing circuit is specifically configured to: receive an input signal, intercept a part between two points of the input signal, generate a to-be-processed signal according to the intercepted part, and generate q output signals according to the to-be-processed signal by using the polynomial fitting method.

In an actual application, the input signal may be segmented at an inflection point, or the input signal may be segmented at any other point. An inflection point of the input signal is a point at which a slope change rate of the input signal is greater than a preset value.

For example, a curve fitting circuit includes three segmentation processing circuits, and inflection points of an input signal are x1, x2, x3, x4, and x5, where x1<x2<x3<x4<x5. A first segmentation processing circuit in the three segmentation processing circuits processes only a part between x1 and x3 of the input signal, a second segmentation processing circuit in the three segmentation processing circuits processes only a part between x2 and x4 of the input signal, and a third segmentation processing circuit in the three segmentation processing circuits processes only a part between x3 and x5 of the input signal.

Optionally, each segmentation processing circuit is specifically configured to: receive an input signal, determine an intercepted part according to an amplitude of the input signal and a preset amplitude range of the segmentation processing circuit, generate a to-be-processed signal according to the intercepted part, and generate q output signals according to the to-be-processed signal by using the polynomial fitting method.

For example, a curve fitting circuit includes three segmentation processing circuits, and an amplitude range of an input signal is [y1, y5]. A first segmentation processing circuit in the three segmentation processing circuits processes only a part of the input signal whose amplitude is within [y1, y3], a second segmentation processing circuit in the three segmentation processing circuits processes only a part of the input signal whose amplitude is within [y2, y4], and a third segmentation processing circuit in the three segmentation processing circuits processes only a part of the input signal whose amplitude is within [y4, y5], where y1<y2≤y3≤y4<y5. That is, preset amplitude ranges of any two segmentation processing circuits may overlap, but cannot be exactly the same.

Figure 4:
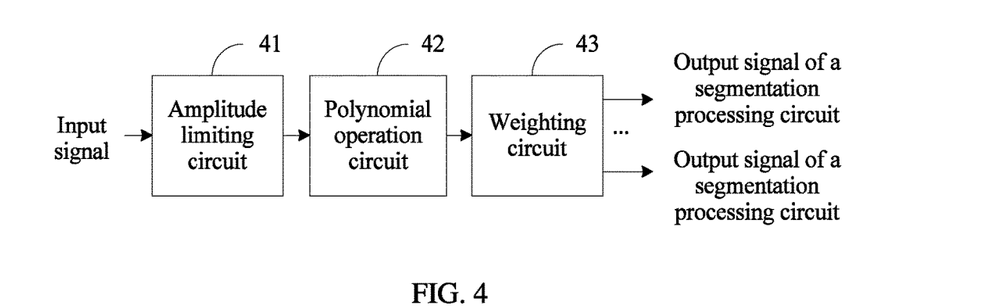
FIG. 4 is a schematic structural diagram of a segmentation processing circuit according to an embodiment of the present invention.

Optionally, as shown in FIG. 4, each segmentation processing circuit includes an amplitude limiting circuit 41, a polynomial operation circuit 42, and a weighting circuit 43.

The amplitude limiting circuit 41 receives an input signal; and generates and outputs, when an amplitude of the input signal is within a preset amplitude range of the segmentation processing circuit at which the amplitude limiting circuit 41 is located, a to-be-processed signal whose amplitude monotonically varies according to the amplitude of the input signal, or outputs a first preset value when an amplitude of the input signal is less than a minimum value of the preset amplitude range, or outputs a second preset value when an amplitude of the input signal is greater than a maximum value of the preset amplitude range. The first preset value is equal to an amplitude of a to-be-processed signal that is generated when the amplitude of the input signal is the minimum value of the preset amplitude range. The second preset value is equal to an amplitude of a to-be-processed signal that is generated when the amplitude of the input signal is the maximum value of the preset amplitude range.

The polynomial operation circuit 42 generates, according to the amplitude of the to-be-processed signal output by the amplitude limiting circuit 41, a value of each order of computation term whose order is not higher than a preset order.

The weighting circuit 43 receives the value of each order of computation term and generates an output signal of the segmentation processing circuit according to a coefficient that is of each order of computation term and that is in weighting coefficients and according to the value of each order of computation term.

If a value of an input signal y is greater than y1 and less than y2, and a preset amplitude range of a segmentation processing circuit is [y3, y4], where y1<y3, and y2>y4, the segmentation processing circuit generates and outputs only a to-be-processed signal whose amplitude monotonically varies, that is, monotonically increases or monotonically decreases, according to an amplitude of a part of the input signal y within [y3, y4]. For a part of the input signal y within [y1,y3], the segmentation processing circuit outputs a to-be-processed signal that is generated when an amplitude of the input signal is y3. For a part of the input signal y within [y4,y2], the segmentation processing circuit outputs a to-be-processed signal that is generated when an amplitude of a signal that is obtained after linear adjustment is y4.

For example, a preset order is 3, an amplitude of a to-be-processed signal received by the polynomial operation circuit 42 is z, and values that are of orders of computation terms and that are generated by the polynomial operation circuit 42 are $z^3$, $z^2$, and z. If a coefficient of a first order of computation term is a1, a coefficient of a second order of computation term is a2, and a coefficient of a third order of computation term is a3, one output signal that is generated by the weighting circuit 43 and that is of the segmentation processing circuit at which the weighting circuit 43 is located is $a3*z^3+a2*z^2+a1*z$. Certainly, the weighting circuit 43 may further add a constant term when generating the output signal of the segmentation processing circuit at which the weighting circuit 43 is located. That is, one generated output signal of the segmentation processing circuit at which the weighting circuit 43 is located is $a3*z^3+a2*z^2+a1*z+a0$, where a0, a1, a2, and a3 are constants.

Figure 5:
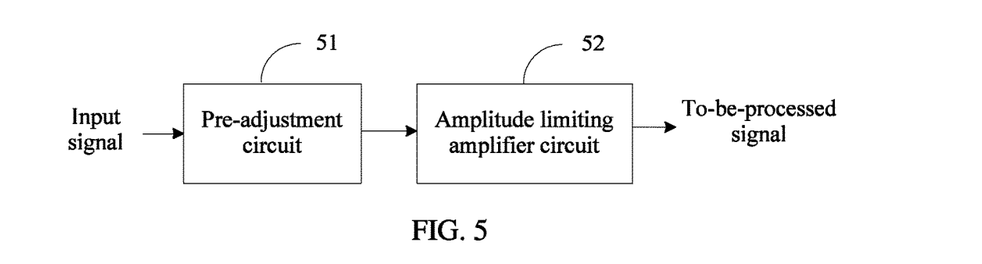
FIG. 5 is a schematic structural diagram of an amplitude limiting circuit according to an embodiment of the present invention.

Optionally, as shown in FIG. 5, the amplitude limiting circuit includes a pre-adjustment circuit 51 and an amplitude limiting amplifier circuit 52.

The pre-adjustment circuit 51 receives an input signal and outputs a signal obtained by amplifying the input signal and/or performing offset adjustment on the input signal.

The pre-adjustment circuit 51 implements offset adjustment and/or amplitude amplification on a signal. A relationship between an input signal x and an output signal y may be represented as $y=a*x+c$, where a is an amplification multiple, and c is a direct current offset. In an actual application, an adder may be used to implement the offset adjustment, and an amplifier may be used to implement the amplitude amplification.

The amplitude limiting amplifier circuit 52 receives the signal output by the pre-adjustment circuit 51; and generates and outputs when an amplitude of the signal output by the pre-adjustment circuit 51 is within an amplitude limiting range of the amplitude limiting amplifier circuit 52, a to-be-processed signal whose amplitude monotonically varies according to the amplitude of the signal output by the pre-adjustment circuit 51, or outputs the first preset value when the amplitude of the signal output by the pre-adjustment circuit 51 is less than a minimum value of the amplitude limiting range of the amplitude limiting amplifier circuit 52, or outputs the second preset value when the amplitude of the signal output by the pre-adjustment circuit 51 is greater than a maximum value of the amplitude limiting range of the amplitude limiting amplifier circuit 52.

A mapping relationship between the amplitude limiting range of the amplitude limiting amplifier circuit 52 and the preset amplitude range of the segmentation processing circuit at which the amplitude limiting amplifier circuit 52 is located is the same as a mapping relationship between the input signal received by the pre-adjustment circuit 51 and the signal output by the pre-adjustment circuit 51.

That is, if a mapping relationship between the input signal x received by the pre-adjustment circuit 51 and the signal y output by the pre-adjustment circuit 51 is $y=f(x)$, a mapping relationship between the amplitude limiting range of the amplitude limiting amplifier circuit 52 and the preset amplitude range of the segmentation processing circuit at which the amplitude limiting amplifier circuit 52 is located is $y'=f(x')$, where x' is a value within the preset amplitude range of the segmentation processing circuit at which the amplitude limiting amplifier circuit 52 is located, and y' is a value within the amplitude limiting range of the amplitude limiting amplifier circuit 52.

The amplitude of the to-be-processed signal output by the amplitude limiting amplifier circuit 52 ranges between the first preset value and the second preset value. When the amplitude of the signal output by the pre-adjustment circuit 51 is less than the minimum value of the amplitude limiting range of the amplitude limiting amplifier circuit 52, the amplitude limiting amplifier circuit 52 outputs the first preset value; or when the amplitude of the signal output by the pre-adjustment circuit 51 is within the preset amplitude range of the segmentation processing circuit, the amplitude limiting amplifier circuit 52 outputs a signal whose amplitude increases according to an increase (or a decrease) in the amplitude of the signal output by the pre-adjustment circuit 51; or when the amplitude of the signal output by the pre-adjustment circuit 51 is greater than the minimum value of the amplitude limiting range of the amplitude limiting amplifier circuit 52, the amplitude limiting amplifier circuit 52 outputs the second preset value.

Figure 6:
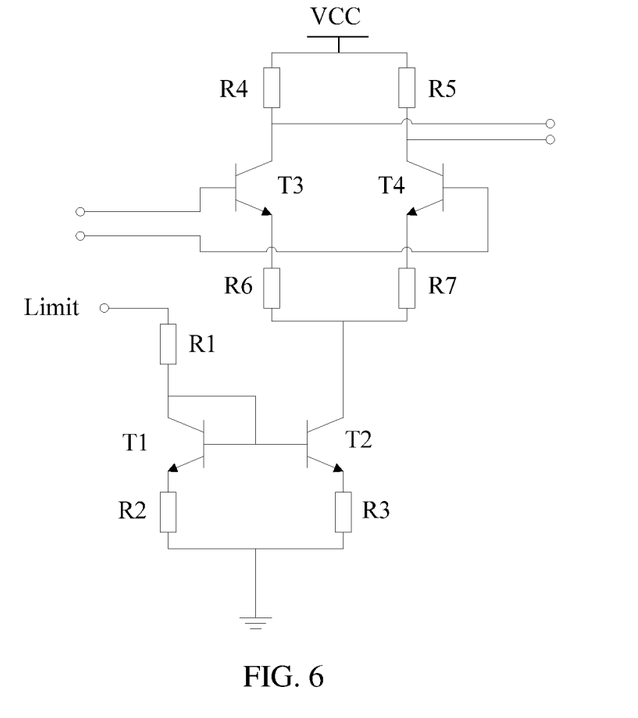
FIG. 6 is a schematic structural diagram of an amplitude limiting amplifier circuit according to an embodiment of the present invention.

Optionally, as shown in FIG. 6, the amplitude limiting amplifier circuit includes a first triode T1, a second triode T2, a third triode T3, a fourth triode T4, a first resistor R1, a second resistor R2, a third resistor R3, a fourth resistor R4, a fifth resistor R5, a sixth resistor R6, and a seventh resistor R7.

One end of the first resistor R1 receives an amplitude-limited signal Limit, and the other end of the first resistor R1 is separately connected to a collector of the first triode T1, a base of the first triode T1, and a base of the second triode T2. An emitter of the first triode T1 is grounded by using the second resistor R2. An emitter of the second triode T2 is grounded by using the third resistor R3. A collector of the second triode T2 outputs a signal related to an amplitude of the amplitude-limited signal Limit.

A base of the third triode T3 receives a first input signal. A base of the fourth triode T4 receives a second input signal. A collector of the third triode T3 is connected to a collector of the fourth triode T4 by sequentially using the fourth resistor R4 and the fifth resistor R5. An emitter of the third triode T3 is connected to an emitter of the fourth triode T4 by sequentially using the sixth resistor R6 and the seventh resistor R7. An end on which the sixth resistor R6 is connected to the seventh resistor R7 receives the signal related to the amplitude of the amplitude-limited signal Limit. A signal on an end on which the fourth resistor R4 is connected to the collector of the third triode T3 is one channel of signal in two channels of signals output by the amplitude limiting amplifier circuit. A signal on an end on which the fifth resistor R5 is connected to the collector of the fourth triode T4 is the other channel of signal in the two channels of signals output by the amplitude limiting amplifier circuit.

A difference between the first input signal and the second input signal is equal to the signal output by the pre-adjustment circuit. A difference between the two channels of signals output by the amplitude limiting amplifier circuit is the to-be-processed signal output by the amplitude limiting circuit at which the amplitude limiting amplifier circuit is located.

In FIG. 6, an end on which the fourth resistor R4 is connected to the fifth resistor R5 receives a power signal VCC.

In FIG. 6, the first resistor R1, the second resistor R2, the third resistor R3, the first triode T1, and the second triode T2 form a proportional current mirror circuit, and a current of the collector of the second triode T2 may be controlled by controlling the amplitude-limited signal Limit. The fourth resistor R4, the fifth resistor R5, the sixth resistor R6, the seventh resistor R7, the third triode T3, and the fourth triode T4 form a differential amplifier. A bias current of the differential amplifier is provided by the foregoing current mirror, that is, the bias current of the differential amplifier is the current of the collector of the second triode T2. Magnitude of a current of the collector of the second triode T2 determines an amplitude limiting range A of the differential amplifier, that is, the magnitude of the current of the collector of the second triode T2 determines that a signal output by the differential amplifier monotonically varies according to an input signal of the differential amplifier when the input signal is within the range A and that a signal output by the differential amplifier no longer varies according to an input signal of the differential amplifier when the input signal is beyond the range A. Therefore, the amplitude limiting range A of the amplitude limiting amplifier circuit may be controlled by controlling the amplitude-limited signal Limit.

Figure 7:
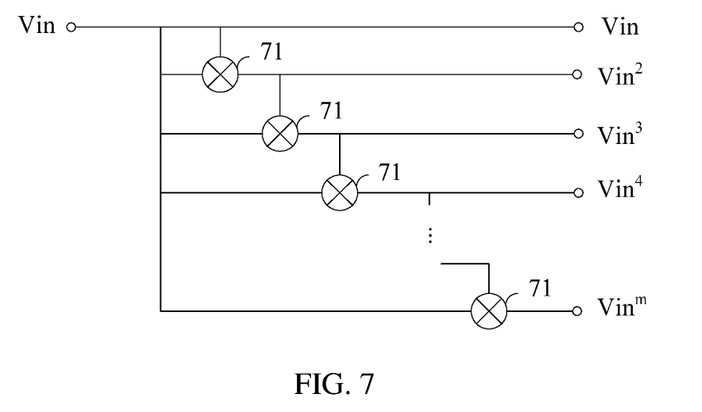
FIG. 7 is a schematic structural diagram of a polynomial operation circuit according to an embodiment of the present invention.

Optionally, as shown in FIG. 7, the preset order is m, the polynomial operation circuit includes m−1 multipliers 71, and one input end of each multiplier 71 receives a signal Vin output by the amplitude limiting circuit in the segmentation processing circuit at which the polynomial operation circuit is located. The other input end of a first multiplier 71 receives the signal Vin output by the amplitude limiting circuit in the segmentation processing circuit at which the polynomial operation circuit is located. The other input end of an $l^{th}$ multiplier 71 receives a signal output by an $(l-1)^{th}$ multiplier, where l=2, . . . , m. A signal output by a $p^{th}$ multiplier 71 is the $(p+1)^{th}$ power of the signal output by the amplitude limiting circuit in the segmentation processing circuit at which the polynomial operation circuit is located, where p=1, . . . , m−1. Generally, p is not greater than 2. If p is greater than 2, a quantity of segmentation processing circuits may be increased, so that the input signal can be divided into more segments, and p can be decreased, that is, the preset order m is decreased. For example, when the curve fitting circuit includes two segmentation processing circuits, and p=4, a quantity of segmentation processing circuits in the curve fitting circuit may be increased to 3, so that p is decreased.

Figure 8:
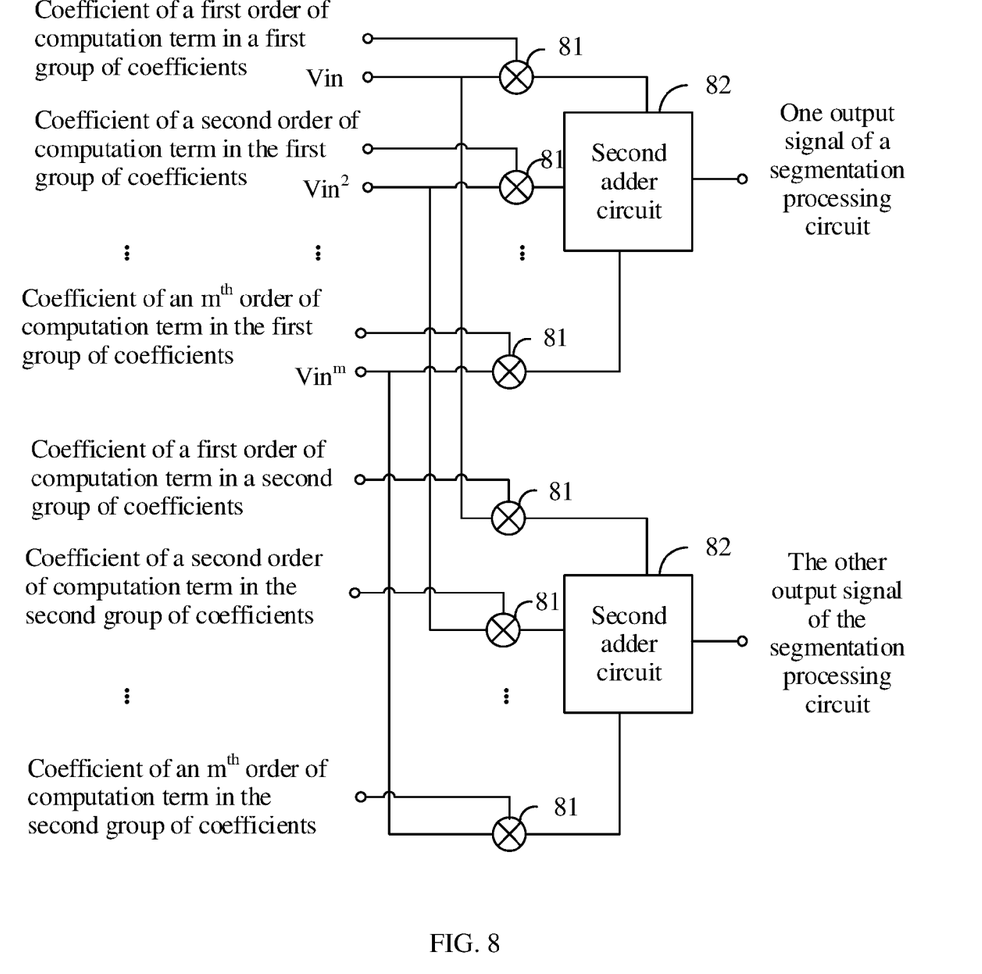
FIG. 8 is a schematic structural diagram of a weighting circuit according to an embodiment of the present invention.

Optionally, as shown in FIG. 8, the preset order is m, and the weighting circuit includes n*m multipliers 81 and n second adder circuits 82, where the n*m multipliers 81 are divided into n groups, each group has m multipliers 81, and n is a natural number.

One input end of each multiplier 81 in a $k^{th}$ group receives one of values that are of orders of computation terms and that are output by the polynomial operation circuit. When one input end of a multiplier 81 in the $k^{th}$ group receives a value that is of an $l^{th}$ order of computation term and that is output by the polynomial operation circuit, and the other input end of the multiplier 81 receives a coefficient that is of the $l^{th}$ order of computation term and that is in a $k^{th}$ group of coefficients in the weighting coefficients. k=1, . . . , n, and l is a natural number not greater than m.

Each second adder circuit 82 outputs a signal obtained by adding signals output by multipliers 81 in a group, and uses the signal as one output signal of the segmentation processing circuit at which the weighting circuit is located.

In FIG. 8, two second adder circuits 82 are used as an example for description. That is, that each segmentation processing circuit has two output signals is used as an example for description. In FIG. 8, when a second adder circuit 82 performs weighted summation on the orders of computation terms, no constant term is added. Therefore, one output signal of the curve fitting circuit is equal to a value of adding a sum of n signals received by a first adder circuit 32 and a constant term. If the second adder circuit 82 adds a constant term when performing the weighted summation on the orders of computation terms, one output signal of the curve fitting circuit is equal to the sum of the n signals received by the first adder circuit 32. Different first adder circuits 32 receive different output signals of a same segmentation processing circuit.

In FIG. 8, all the multipliers are four-quadrant multipliers. That is, in FIG. 8, a signal received by each multiplier may be positive or negative. A coefficient of each order of computation term varies slowly and is generally configured digitally. Therefore, two input ends of a multiplier may be asymmetrically designed, and only a multiplication function needs to be implemented.

An embodiment of the present invention provides an analog predistorter, including a curve fitting circuit.

An embodiment of the present invention provides a radio frequency signal transmitter, including a curve fitting circuit.

A person skilled in the art should understand that the embodiments of the present invention may be provided as a method, a system, or a computer program product. Therefore, the present invention may use a form of hardware only embodiments, software only embodiments, or embodiments with a combination of software and hardware. Moreover, the present invention may use a form of a computer program product that is implemented on one or more computer-usable storage media (including but not limited to a disk memory, a CD-ROM, an optical memory, and the like) that include computer-usable program code.

The present invention is described with reference to the flowcharts and/or block diagrams of the method, the device (system), and the computer program product according to the embodiments of the present invention. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred embodiments of the present invention have been described, persons skilled in the art can make changes and modifications to these embodiments once they learn the basic inventive concept. Therefore, the following claims are intended to be construed as to cover the preferred embodiments and all changes and modifications falling within the scope of the present invention.

Obviously, persons skilled in the art can make various modifications and variations to the embodiments of the present invention without departing from the spirit and scope of the embodiments of the present invention. The present invention is intended to cover these modifications and variations provided that they fall within the scope of protection defined by the following claims and their equivalent technologies.

What is claimed is:

1. A curve fitting circuit, comprising:
   n segmentation processing circuits, wherein n is greater than or equal to 2; and
   q first adder circuits, wherein q is a natural number;
   wherein each segmentation processing circuit of the n segmentation processing circuits is configured to:
      receive an input signal;
      intercept a part of the input signal according to a preset rule;
      generate a to-be-processed signal according to the intercepted part; and
      generate q output signals according to the to-be-processed signal using a polynomial fitting method, wherein parts of the input signal intercepted by different segmentation processing circuits are not exactly the same; and
   wherein each first adder circuit is configured to:
      receive one signal in the q output signals of each segmentation processing circuit; and
      obtain one output signal of the curve fitting circuit according to a sum of received n signals, wherein different first adder circuits receive different output signals in q output signals of a same segmentation processing circuit.

2. The curve fitting circuit according to claim 1, wherein obtaining the one output signal of the curve fitting circuit according to the sum of received n signals comprises:
   when none of the received q output signals of each segmentation processing circuit comprise a constant term, use a signal, obtained by adding the sum of the received n signals to a constant term, as the one output signal of the curve fitting circuit; or
   when q output signals of at least one segmentation processing circuit comprise a constant term, use the sum of the received n signals as the one output signal of the curve fitting circuit.

3. The curve fitting circuit according to claim 1, wherein intercepting a part of the input signal according to a preset rule comprises:
   determining the intercepted part according to an amplitude of the input signal and a preset amplitude range of the segmentation processing circuit.

4. The curve fitting circuit according to claim 1, wherein intercepting a part of the input signal according to a preset rule comprises:
   intercepting a part between two points of the input signal.

5. The curve fitting circuit according to claim 4, wherein each segmentation processing circuit comprises an amplitude limiting circuit, a polynomial operation circuit, and a weighting circuit;
   wherein the amplitude limiting circuit is configured to:
      receive an input signal; and
      generates and output, when an amplitude of the input signal is within a preset amplitude range of the segmentation processing circuit at which the amplitude limiting circuit is located, a to-be-processed signal whose amplitude monotonically varies according to the amplitude of the input signal, or outputs a first preset value when the amplitude of the input signal is less than a minimum value of the preset amplitude range, or outputs a second preset value when the amplitude of the input signal is greater than a maximum value of the preset amplitude range, wherein the first preset value is equal to an amplitude of a to-be-processed signal that is generated when the amplitude of the input signal is the minimum value of the preset amplitude range, and the second preset value is equal to an amplitude of a to-be-processed signal that is generated when the amplitude of the input signal is the maximum value of the preset amplitude range;
   wherein the polynomial operation circuit is configured to generate, according to the amplitude of the to-be-processed signal output by the amplitude limiting circuit, a value of each order of computation term whose order is not higher than a preset order; and
   wherein the weighting circuit is configured to receive the value of each order of computation term and generate an output signal of the segmentation processing circuit according to a coefficient that is of each order of computation term and that is in weighting coefficients and according to the value of each order of computation term.

6. The curve fitting circuit according to claim 5, wherein the amplitude limiting circuit comprises a pre-adjustment circuit and an amplitude limiting amplifier circuit;
   wherein the pre-adjustment circuit is configured to receive an input signal and output a signal obtained by amplifying the input signal and/or performing offset adjustment on the input signal; and
   wherein the amplitude limiting amplifier circuit is configured to:
      receive the signal output by the pre-adjustment circuit; and
      generate and output, when an amplitude of the signal output by the pre-adjustment circuit is within an amplitude limiting range of the amplitude limiting amplifier circuit, a to-be-processed signal whose amplitude monotonically varies according to the amplitude of the signal output by the pre-adjustment circuit, or output the first preset value when the amplitude of the signal output by the pre-adjustment circuit is less than a minimum value of the amplitude limiting range of the amplitude limiting amplifier circuit, or output the second preset value when the amplitude of the signal output by the pre-adjustment circuit is greater than a maximum value of the amplitude limiting range of the amplitude limiting amplifier circuit;
   wherein a mapping relationship between the amplitude limiting range of the amplitude limiting amplifier circuit and the preset amplitude range of the segmentation processing circuit at which the amplitude limiting amplifier circuit is located is the same as a mapping relationship between the input signal received by the pre-adjustment circuit and the signal output by the pre-adjustment circuit.

7. The curve fitting circuit according to claim 6, wherein the amplitude limiting amplifier circuit comprises a first triode, a second triode, a third triode, a fourth triode, a first resistor, a second resistor, a third resistor, a fourth resistor, a fifth resistor, a sixth resistor, and a seventh resistor;

wherein one end of the first resistor is configured to receive an amplitude-limited signal, the other end of the first resistor is separately connected to a collector of the first triode, a base of the first triode, and a base of the second triode, wherein an emitter of the first triode is configured to be grounded by using the second resistor, an emitter of the second triode is configured to be grounded by using the third resistor, and a collector of the second triode is configured to output a signal related to an amplitude of the amplitude-limited signal;

wherein a base of the third triode is configured to receive a first input signal, a base of the fourth triode is configured to receive a second input signal, a collector of the third triode is connected to a collector of the fourth triode by sequentially using the fourth resistor and the fifth resistor, an emitter of the third triode is connected to an emitter of the fourth triode by sequentially using the sixth resistor and the seventh resistor, an end on which the sixth resistor is connected to the seventh resistor is configured to receive the signal related to the amplitude of the amplitude-limited signal, a signal on an end on which the fourth resistor is connected to the collector of the third triode is one channel of signal in two channels of signals configured to be output by the amplitude limiting amplifier circuit, and a signal on an end on which the fifth resistor is connected to the collector of the fourth triode is the other channel of signal in the two channels of signals output by the amplitude limiting amplifier circuit;

wherein a difference between the first input signal and the second input signal is equal to the signal output by the pre-adjustment circuit, and a difference between the two channels of signals output by the amplitude limiting amplifier circuit is the to-be-processed signal output by the amplitude limiting circuit at which the amplitude limiting amplifier circuit is located.

8. The curve fitting circuit according to claim 5, wherein the preset order is m, the polynomial operation circuit comprises m−1 multipliers, and one input end of each multiplier receives a signal output by the amplitude limiting circuit in the segmentation processing circuit at which the polynomial operation circuit is located; and wherein the other input end of a first multiplier receives the signal output by the amplitude limiting circuit in the segmentation processing circuit at which the polynomial operation circuit is located, and the other input end of an $l^{th}$ multiplier receives a signal output by an $(l-1)^{th}$ multiplier, wherein l=2, . . . , m; and a signal output by a $p^{th}$ multiplier is the $(p+1)^{th}$ power of the signal output by the amplitude limiting circuit in the segmentation processing circuit at which the polynomial operation circuit is located, wherein p=1, . . . , m−1.

9. The curve fitting circuit according to claim 5, wherein the preset order is m, and the weighting circuit comprises n*m multipliers and n second adder circuits, wherein the n*m multipliers are divided into n groups, each group has m multipliers, and n is a natural number;

wherein one input end of each multiplier in a $k^{th}$ group receives one of values that are of orders of computation terms and that are output by the polynomial operation circuit;

wherein when one input end of a multiplier in the $k^{th}$ group receives a value that is of an $l^{th}$ order of computation term and that is output by the polynomial operation circuit, and the other input end of the multiplier receives a coefficient that is of the $l^{th}$ order of computation term and that is in a $k^{th}$ group of coefficients in the weighting coefficients, wherein k=1, n, and l is a natural number not greater than m; and wherein each second adder circuit outputs a signal obtained by adding signals output by multipliers in a group, and uses the signal as one output signal of the segmentation processing circuit at which the weighting circuit is located.

10. An analog predistorter, comprising a curve fitting circuit, the curve fitting circuit comprising:

n segmentation processing circuits, wherein n is greater than or equal to 2; and q first adder circuits, wherein q is a natural number;

wherein each segmentation processing circuit of the n segmentation processing circuits is configured to:

receive an input signal;

intercept a part of the input signal according to a preset rule;

generate a to-be-processed signal according to the intercepted part; and generate q output signals according to the to-be-processed signal using a polynomial fitting method, wherein parts of the input signal intercepted by different segmentation processing circuits are not exactly the same; and wherein each first adder circuit is configured to:

receive one signal in the q output signals of each segmentation processing circuit; and obtain one output signal of the curve fitting circuit according to a sum of received n signals, wherein different first adder circuits receive different output signals in q output signals of a same segmentation processing circuit.

11. The analog predistorter according to claim 10, wherein obtaining the one output signal of the curve fitting circuit according to the sum of received n signals comprises:

when none of the received q output signals of each segmentation processing circuit comprise a constant term, use a signal, obtained by adding the sum of the received n signals to a constant term, as the one output signal of the curve fitting circuit; or when q output signals of at least one segmentation processing circuit comprise a constant term, use the sum of the received n signals as the one output signal of the curve fitting circuit.

12. The analog predistorter according to claim 11, wherein intercepting a part of the input signal according to a preset rule comprises:

determining the intercepted part according to an amplitude of the input signal and a preset amplitude range of the segmentation processing circuit.

13. The analog predistorter according to claim 11, wherein intercepting a part of the input signal according to a preset rule comprises:

intercepting a part between two points of the input signal.

14. A radio frequency signal transmitter, comprising a curve fitting circuit, the curve fitting circuit comprising:

n segmentation processing circuits, wherein n is greater than or equal to 2; and q first adder circuits, wherein q is a natural number;

wherein each segmentation processing circuit of the n segmentation processing circuits is configured to:

receive an input signal;

intercept a part of the input signal according to a preset rule;

generate a to-be-processed signal according to the intercepted part; and generate q output signals according to the to-be-processed signal using a polynomial fitting method, wherein parts of the input signal intercepted by different segmentation processing circuits are not exactly the same; and wherein each first adder circuit is configured to:

receive one signal in the q output signals of each segmentation processing circuit; and obtain one output signal of the curve fitting circuit according to a sum of received n signals, wherein different first adder circuits receive different output signals in q output signals of a same segmentation processing circuit.

15. The radio frequency signal transmitter according to claim 14, wherein obtaining the one output signal of the curve fitting circuit according to the sum of received n signals comprises:

when none of the received q output signals of each segmentation processing circuit comprise a constant term, use a signal, obtained by adding the sum of the received n signals to a constant term, as the one output signal of the curve fitting circuit; or when q output signals of at least one segmentation processing circuit comprise a constant term, use the sum of the received n signals as the one output signal of the curve fitting circuit.

16. The radio frequency signal transmitter according to claim 14, wherein intercepting a part of the input signal according to a preset rule comprises:

determining the intercepted part according to an amplitude of the input signal and a preset amplitude range of the segmentation processing circuit.

17. The radio frequency signal transmitter according to claim 14, wherein intercepting a part of the input signal according to a preset rule comprises:

intercepting a part between two points of the input signal.

\* \* \* \* \*